United States Patent
Koo et al.

(10) Patent No.: US 7,816,666 B2
(45) Date of Patent: Oct. 19, 2010

(54) PREVENTING SUBSTRATE DEFORMATION

(75) Inventors: Jae-Bon Koo, Suwon-si (KR);
Hyun-Soo Shin, Suwon-si (KR);
Min-Chul Suh, Suwon-si (KR);
Yeon-Gon Mo, Suwon-si (KR)

(73) Assignee: Samsung Mobile Display Co., Ltd.,
Nongseo-Dong, Giheung-Gu, Yongin,
Gyunggi-Do (KR)

( * ) Notice: Subject to any disclaimer, the term of this patent is extended or adjusted under 35 U.S.C. 154(b) by 697 days.

(21) Appl. No.: 11/271,867

(22) Filed: Nov. 14, 2005

(65) Prior Publication Data
US 2006/0108653 A1 May 25, 2006

(30) Foreign Application Priority Data
Nov. 20, 2004 (KR) .............. 10-2004-0095535

(51) Int. Cl.
*H01L 29/08* (2006.01)
*H01L 35/24* (2006.01)
*H01L 51/00* (2006.01)

(52) U.S. Cl. .......... 257/40; 257/397; 257/59; 257/72; 313/504; 313/506

(58) Field of Classification Search .......... 257/40, 257/397, 57, 59, 66, 69, 70, 73; 313/504, 313/506
See application file for complete search history.

(56) References Cited

U.S. PATENT DOCUMENTS

| | | | |
|---|---|---|---|
| 5,319,479 A | | 6/1994 | Yamada et al. |
| 6,429,053 B1 * | | 8/2002 | Yamazaki et al. ........ 438/149 |
| 6,787,796 B2 * | | 9/2004 | Do et al. ........ 257/40 |
| 6,794,277 B2 * | | 9/2004 | Machida et al. ........ 438/535 |
| 2002/0190332 A1 * | | 12/2002 | Lee et al. ........ 257/397 |
| 2003/0062519 A1 * | | 4/2003 | Yamazaki et al. ........ 257/40 |
| 2003/0077886 A1 * | | 4/2003 | Machida et al. ........ 438/535 |
| 2003/0164496 A1 * | | 9/2003 | Do et al. ........ 257/40 |
| 2004/0046173 A1 * | | 3/2004 | Fukada ........ 257/66 |
| 2004/0053431 A1 * | | 3/2004 | Chang et al. ........ 438/30 |
| 2004/0056591 A1 * | | 3/2004 | Koo et al. ........ 313/506 |
| 2005/0006768 A1 * | | 1/2005 | Narasimhan et al. ........ 257/751 |
| 2005/0206304 A1 * | | 9/2005 | Kim ........ 313/504 |

(Continued)

FOREIGN PATENT DOCUMENTS

JP    03-179778    8/1991

(Continued)

OTHER PUBLICATIONS

*Office Action* from the Japanese Patent Office issued in Applicant's corresponding Japanese Patent Application No. 2005-223203 dated Jul. 29, 2008.

(Continued)

*Primary Examiner*—Michael Trinh
*Assistant Examiner*—Telly D Green
(74) *Attorney, Agent, or Firm*—Robert E. Bushnell, Esq.

(57) ABSTRACT

A substrate prevented from being deformed due to thermal stress or deposition stress includes a deformation preventing layer arranged on one surface of the substrate. The substrate can include a thin film transistor arranged on one surface of the substrate and the deformation preventing layer, arranged on the another surface of the substrate, and including at least one layer.

8 Claims, 5 Drawing Sheets

U.S. PATENT DOCUMENTS

| | | | |
|---|---|---|---|
| 2006/0019573 A1* | 1/2006 | Koo et al. | 445/24 |
| 2006/0022587 A1* | 2/2006 | Jeong et al. | 313/504 |
| 2006/0043360 A1* | 3/2006 | Kim et al. | 257/40 |
| 2006/0082292 A1* | 4/2006 | Kang et al. | 313/504 |
| 2006/0097263 A1* | 5/2006 | Lee et al. | 257/72 |

FOREIGN PATENT DOCUMENTS

| | | |
|---|---|---|
| JP | 04-144170 | 5/1992 |
| JP | 11-153788 | 6/1999 |
| JP | 2002-243974 | 9/2000 |
| JP | 2002-122846 | 4/2002 |
| JP | 2002-289861 | 10/2002 |
| JP | 2003-058078 | 2/2003 |
| JP | 2004-109975 | 4/2004 |
| JP | 2005-292574 | 10/2005 |

OTHER PUBLICATIONS

Office action from the Japanese Patent office issued in Applicant's corresponding Japanese Patent Application No. 2005-223203 dated Nov. 26, 2008.

* cited by examiner

PREVENTING SUBSTRATE DEFORMATION

CLAIM OF PRIORITY

This application makes reference to, incorporates the same herein, and claims all benefits accruing under 35 U.S.C. §119 from an application for SUBSTRATE AND SUBSTRATE WITH THIN FILM TRANSISTOR earlier filed in the Korean Intellectual Property Office on 20 Nov. 2004 and there duly assigned Serial No. 10-2004-0095535.

BACKGROUND OF THE INVENTION

1. Field of the Invention

The present invention relates to preventing a substrate from being deformed due to thermal stress or deposition stress.

2. Description of the Related Art

Recent mobile display devices and flexible display devices, which are increasingly demanded, are required to be thin, light, and unbreakable.

Mobile display devices and flexible display devices can be thin and light by using a thin glass substrate. This thin glass substrate cannot be easily handled and accurately aligned and is weak with respect to withstanding external impact. To solve these problems, a method of using an existing glass substrate and then chemically or mechanically thinning the glass substrate has been adopted. This method, however, is complicated, and the thinned glass substrate is still weak with respect to withstanding external impact. Thus, this method cannot be used in practice.

To solve these problems resulting from the use of glass substrates, a method of using a plastic substrate that is more flexible than the glass substrates and not easily damaged by external impact has been used. However, this plastic substrate has a low thermal resistance, so it cannot bear a high-temperature process, such as, a formation of a polycrystalline silicon thin film transistor and other depositions.

To solve these problems, a method of using a metal substrate having high thermal resistance and high flexibility has been proposed. However, when a layer is deposited on a metal substrate and the resultant metal substrate undergoes a high-temperature process, the resultant metal substrate is deformed due to a difference between thermal expansion coefficients of the substrate and the layer. For example, when the thermal expansion coefficient of the layer is greater than that of the metal substrate, the metal substrate is convex in a direction of the layer. To the contrary, when the thermal expansion coefficient of the metal substrate is greater than that of the layer, the metal substrate is convex in the direction opposite to the direction of the layer. Of course, this problem can occur not only using a metal substrate but can also occur using other substrates.

SUMMARY OF THE INVENTION

The present invention provides a substrate that is prevented from being deformed due to thermal stress or deposition stress.

According to one aspect of the present invention, a substrate is provided comprising: a thin film transistor arranged on one surface of the substrate; and a deformation preventing layer, arranged on another surface of the substrate, and including at least one layer.

The substrate preferably further comprises a planarization layer arranged on the one surface of the substrate, wherein the thin film transistor is arranged on the planarization layer, and the deformation preventing layer is of the same material and thickness as a material and thickness of the planarization layer.

The planarization layer preferably comprises silicon oxide.

The substrate preferably further comprises: a planarization layer arranged on the one surface of the substrate; and a buffer layer arranged on the planarization layer, wherein the thin film transistor is arranged on the buffer layer, and the deformation preventing layer includes a first layer of the same material and thickness as the material and thickness of the planarization layer and a second layer formed of the same material and thickness as the material and thickness of the buffer layer.

The planarization layer preferably comprises silicon oxide.

The substrate preferably further comprises a protective film arranged on the entire area of the one surface of the substrate to cover the thin film transistor.

The deformation preventing layer preferably is of the same material and thickness as a material and thickness of the protective film.

The substrate preferably further comprises a planarization layer arranged on the one surface of the substrate, wherein the thin film transistor is arranged on the planarization layer, and the deformation preventing layer includes a first layer of the same material and thickness as the material and thickness of the planarization layer and a third layer of the same material and thickness as the material and thickness of the protective film.

The planarization layer comprises silicon oxide.

The substrate preferably further comprises: a planarization layer arranged on the one surface of the substrate; and a buffer layer arranged on the planarization layer, wherein the thin film transistor is arranged on the buffer layer, and the deformation preventing layer includes a first layer of the same material and thickness as the material and thickness of the planarization layer, a second layer of the same material and thickness as the material and thickness of the buffer layer, and a third layer of the same material and thickness as the material and thickness of the protective film.

The planarization layer preferably comprises silicon oxide.

The deformation preventing layer is preferably arranged on the one surface of the substrate and includes layers of the same material and thickness as layers formed on the entire area of the one surface of the substrate.

The substrate preferably comprises a metal substrate.

According to another aspect of the present invention, a laminated substrate is provided comprising: a substrate; and a deformation preventing layer arranged on one surface of the substrate.

The laminated substrate preferably further comprising a planarization layer arranged on another surface of the substrate.

The deformation preventing layer is preferably of the same material and thickness as a material and thickness of the planarization layer.

The planarization layer preferably comprises silicon oxide.

The substrate preferably comprises a metal substrate.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Mobile display devices and flexible display devices can be thin and light by using a thin glass substrate. This thin glass substrate cannot be easily handled and accurately aligned and is weak with respect to withstanding external impact.

Figure 1:
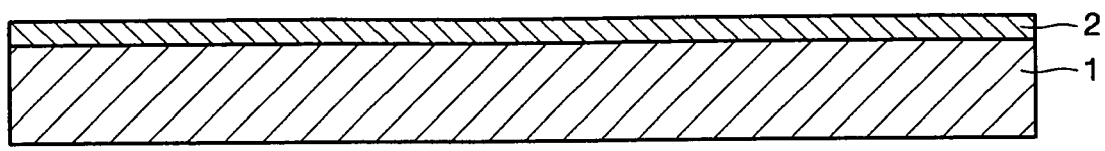
FIG. 1 is a schematic cross-section of a stack of two layers having different thermal expansion coefficients.
Figure 2:
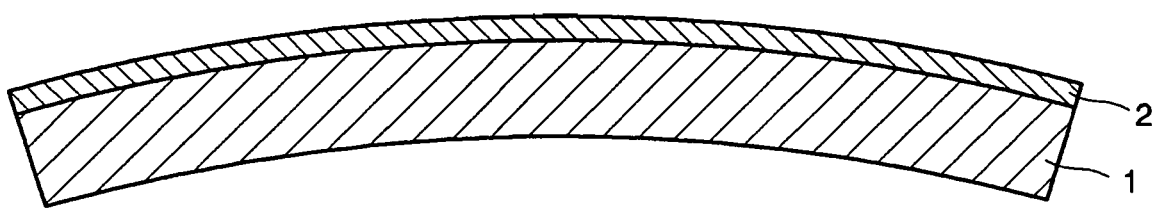
FIGS. 2 and 3 are schematic cross-sections of the layer stack of FIG. 1 deformed by a thermal stress.
Figure 3:
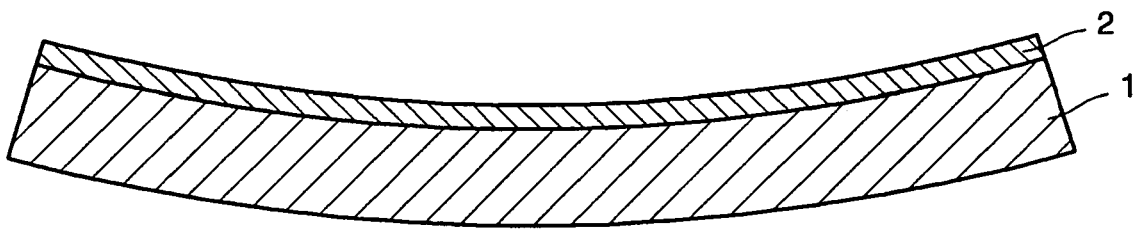

To solve these problems, a method of using a metal substrate having high thermal resistance and high flexibility has been proposed. However, when a layer 2 is deposited on a metal substrate 1 and the resultant metal substrate 1 undergoes a high-temperature process, as shown in FIG. 1, the resultant metal substrate 1 is deformed due to a difference between thermal expansion coefficients of the substrate 1 and the layer 2. For example, when the thermal expansion coefficient of the layer 2 is greater than that of the metal substrate 1, as shown in FIG. 2, the metal substrate 1 is convex in a direction of the layer 2. To the contrary, when the thermal expansion coefficient of the metal substrate 1 is greater than that of the layer 2, as shown in FIG. 3, the metal substrate 1 is convex in the direction opposite to the direction of the layer 2. Of course, this problem can occur not only using a metal substrate but can also occur using other substrates.

Figure 4:
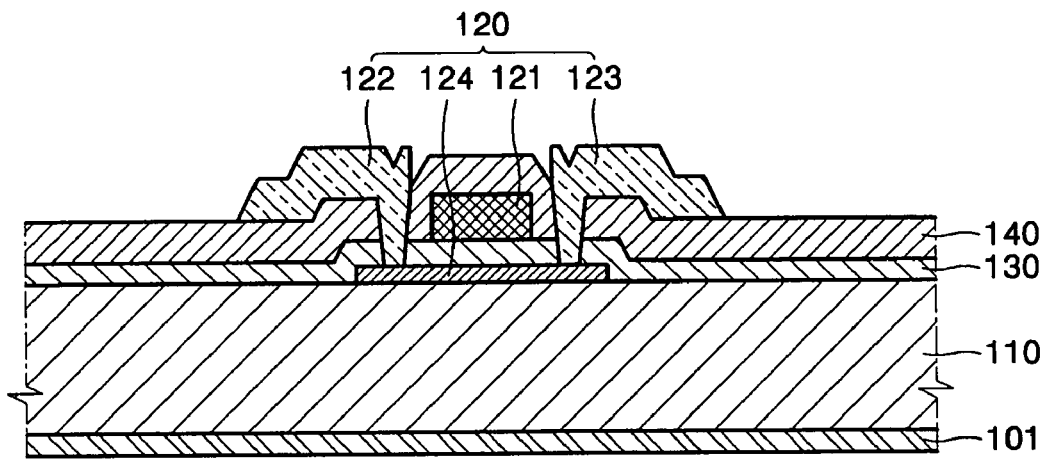
FIG. 4 is a schematic cross-section of a substrate including a thin film transistor, according to an embodiment of the present invention.

FIG. 4 is a schematic cross-section of a substrate 110 including a thin film transistor 120, according to an embodiment of the present invention. Referring to FIG. 4, the thin film transistor 120 is formed on one surface of the substrate 110, and a deformation preventing layer 101 including at least one layer is formed on the other surface of the substrate 110. The substrate 110 can be a metal substrate or a substrate of other various materials.

The thin film transistor 120 includes a gate electrode 121, which is formed of MoW, etc., a source electrode 122 and a drain electrode 123, which are insulated from the gate electrode 121, and a semiconductor layer 124, which is insulated from the gate electrode 121 and contacts the source electrode 122 and the drain electrode 123. To insulate the semiconductor layer 124 from the gate electrode 121, a gate insulation film 130 is arranged between the semiconductor layer 124 and the gate electrode 121. The source electrode 122 and the drain electrode 123 can be insulated from the gate electrode 121 with an interlayer insulation film 140.

In this embodiment, a polycrystalline silicon layer can be used as the semiconductor layer 124. The polycrystalline silicon layer is produced through a crystallization process of transforming an amorphous silicon layer into a polycrystalline silicon layer. Examples of a crystallization process corresponding to a low-temperature process include laser annealing, Metal-Induced Crystallization (MIC), etc. The polycrystalline silicon layer is usually produced using an eximer laser annealing method of melting an amorphous silicon layer using a laser and then simultaneously cooling the melted amorphous silicon layer and growing grains or using a sequential lateral solidification method based on the fact that polycrystalline silicon grains grow vertically from a boundary between a liquid area of the amorphous silicon layer irradiated by laser and a solid area thereof not irradiated by laser.

Generally, a process of forming a thin film transistor on a substrate is a high-temperature process, and particularly, such crystallization processes are high-temperature processes. Hence, deformation due to heat, exfoliation of layers, etc. can occur during the manufacture of a thin film transistor.

If the deformation preventing layer 101 is not formed on the substrate 101, the substrate 110 can be curved by thermal stress in a direction closer to the thin film transistor 120 or in the opposite direction. Accordingly, the curving can be prevented by applying a stress to the substrate 110 in the direction opposite to the direction where the thermal stress is applied.

In other words, when the substrate 110 has no deformation preventing layer 101 formed thereon and is bent in the direction becoming closer to the thin film transistor 120 formed on one surface of the substrate 110 similarly to what is shown in FIG. 2, the deformation preventing layer 101 is formed of a material having a smaller thermal expansion coefficient than the substrate 110 on the other surface of the substrate 110, so that deformation of the substrate 110 due to a thermal stress can be prevented. Also, when the substrate 110 has no deformation preventing layer 101 formed thereon and is bent in the direction becoming farther from the thin film transistor 120 formed on one surface of the substrate 110 similarly to what is shown in FIG. 3, the deformation preventing layer 101 is formed of a material having a larger thermal expansion coefficient than the substrate 110 on the other surface of the substrate 110, so that deformation of the substrate 110 due to a thermal stress can be prevented. That is, the material and thickness of the deformation prevention layer 101 can be adequately selected according to a direction and degree in which the substrate 110 is bent, so that deformation of the substrate 110 can be prevented. The prevention of deformation of the substrate 110 helps to prevent detachment between layers, etc.

Since processes subsequent to the formation of the thin film transistor 120 on the substrate 110, for example, deposition of an organic/inorganic material, can also be high-temperature processes, deformation of the substrate 110 or detachment between layers can occur due to a difference between thermal expansion coefficients of the layers. However, they can be prevented by the deformation prevention layer 101 formed on the other surface of the substrate 110.

Although this embodiment refers to a polycrystalline silicon thin film transistor, various thin film transistors can be applied to the present invention. This rule is equally applied to embodiments to be described later. For convenience, the following embodiments only deal with the polycrystalline silicon thin film transistor shown in FIG. 4.

Figure 5:
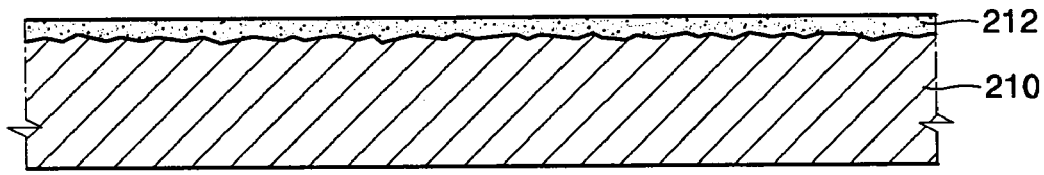
FIG. 5 is a schematic cross-section of a metal substrate having a planarization layer formed thereon.
Figure 6:
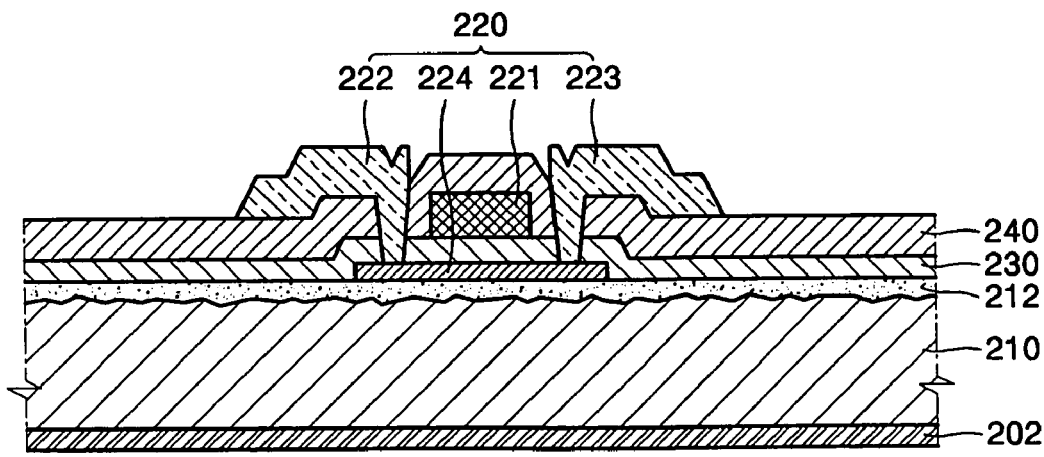
FIG. 6 is a schematic cross-section of a substrate including a thin film transistor, according to another embodiment of the present invention.

FIG. 5 is a schematic cross-section of a metal substrate 210 having a planarization layer 212 formed thereon. FIG. 6 is a schematic cross-section of the metal substrate 210 including a thin film transistor 220, according to another embodiment of the present invention.

The metal substrate 210 has high flexibility and high heat resistance. As shown in FIG. 5, one surface of the metal substrate 210 is very rough, so it needs to be planarized before forming a thin film transistor or the like thereon. The planarization can be performed by first chemically or mechanically polishing the rough surface of the metal substrate 210 and then forming the planarization layer 212 on the polished surface of the metal substrate 210. In this case, the planarization layer 212 has a thickness of about 5000 to 10000 Å, so it has an internal stress. Hence, it is preferable that the planarization layer 212 is formed of a silicon oxide material having a small internal stress. This preference is equally applied to the following embodiments.

However, the planarization layer 212 expands with a thermal stress, so it has a different thermal expansion coefficient from the substrate 210. The thermal expansion coefficient difference causes a deformation of the substrate 210. In particular, when a semiconductor layer 224 is formed of polycrystalline silicon on the planarization layer 212 to form the thin film transistor 220, the substrate 210 must undergoes a high temperature process, so it is important to minimize the deformation due to the difference between the thermal expansion coefficients of the planarization layer 212 and the substrate 210. This deformation can be prevented by forming a deformation preventing layer 202 on the other surface of the substrate 210.

In this case, the material and thickness of the deformation preventing layer are preferably the same as those of the planarization layer 212, because a deformation of the substrate 210 caused by the difference between the thermal expansion coefficients of the planarization layer 212 and the substrate 210 can be prevented by applying a stress of the same size as a thermal stress applied to the substrate 210 to the substrate 210 in the direction opposite to the direction where the thermal stress is applied.

Figure 7:
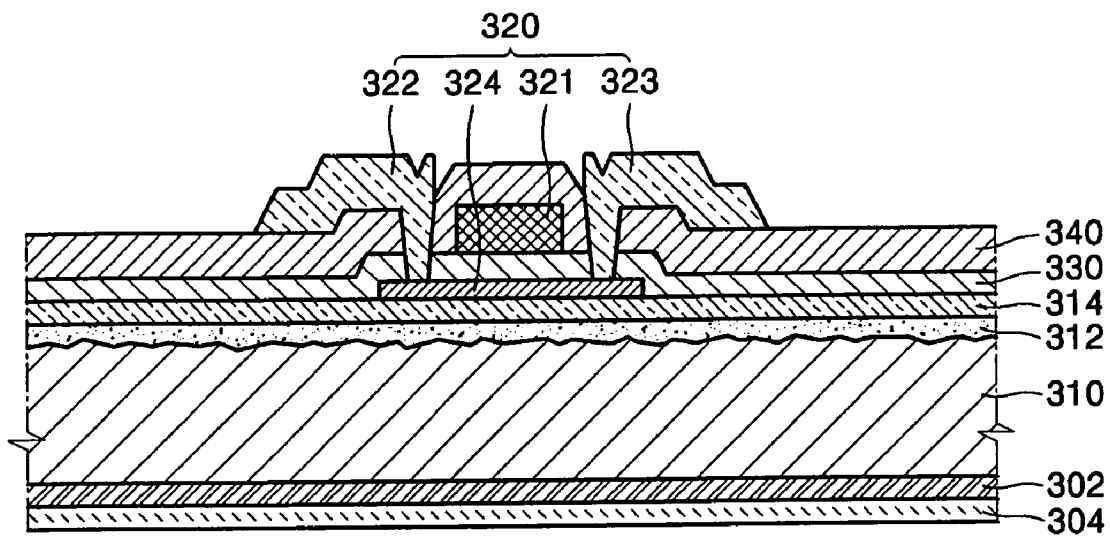
FIG. 7 is a schematic cross-section of a substrate including a thin film transistor, according to another embodiment of the present invention.

FIG. 7 is a schematic cross-section of a substrate 310 including a thin film transistor 320, according to another embodiment of the present invention. The substrate 310 in this embodiment is different from the substrate 210 of FIG. 6 in that a buffer layer 314 is formed on a planarization layer 312, which is formed on one surface of the substrate 310, and that a deformation preventing layer formed on the other surface of the substrate 310 includes a first layer 302 and a second layer 304.

The first layer 302 serves as a layer formed to offset a thermal stress produced due to a distance between thermal expansion coefficients of the planarization layer 312 and the substrate 310.

The thin film transistor 320 controls signals flowing between a source electrode 322 and a drain electrode 323 according to a signal applied to a gate electrode 321. To do this properly, a semiconductor layer 324 in which a channel between the source and drain electrodes 322 and 323 is formed should be protected from external contaminants. In this embodiment, to prevent the external contaminants from penetrating through the semiconductor layer 324, a buffer layer 314 is formed below the semiconductor 324. However, a thermal stress produced due to a difference between thermal expansion coefficients of the buffer layer 314 and the substrate 310 can be applied to the substrate 310 again. In this case, the second layer 304 offsets the thermal stress.

Since the first layer 302 is used to offset the thermal stress produced due to the planarization layer 312, the first layer 302 is preferably formed of the same material and to the same thickness as the planarization layer 312. Since the second layer 304 is used to offset the thermal stress produced due to the buffer layer 314, the second layer 304 is preferably formed of the same material and to the same thickness as the buffer layer 314.

Figure 8:
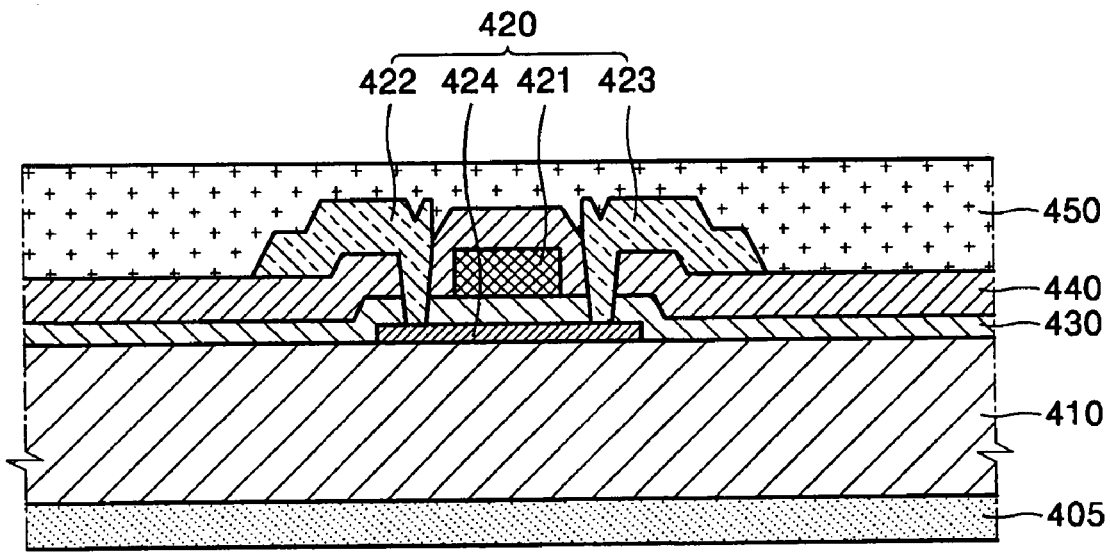
FIG. 8 is a schematic cross-section of a substrate including a thin film transistor, according to another embodiment of the present invention.

FIG. 8 is a schematic cross-section of a substrate 410 including a thin film transistor 420, according to another embodiment of the present invention. Generally, a protective film 450 can be included to cover the thin film transistor 420 formed on one surface of the substrate 410. In addition to protecting the thin film transistor 420 from external contaminants, the protective film 450 planarizes the upper surface of the thin film transistor 420 prior to forming various component parts on the thin film transistor 420.

The formation of various component parts on the thin film transistor 420 can be a high temperature process. In this case, a deformation of the substrate 410, detachment among layers, etc. can occur due to a difference between thermal expansion coefficients of the protective film 450 and the substrate 410. Hence, a deformation preventing layer 405 is formed to offset a thermal stress produced due to the difference between the thermal expansion coefficients of the protective film 450 and the substrate 410. The material and thickness of the deformation preventing layer 405 are preferably the same as those of the protective film 450.

Figure 9:
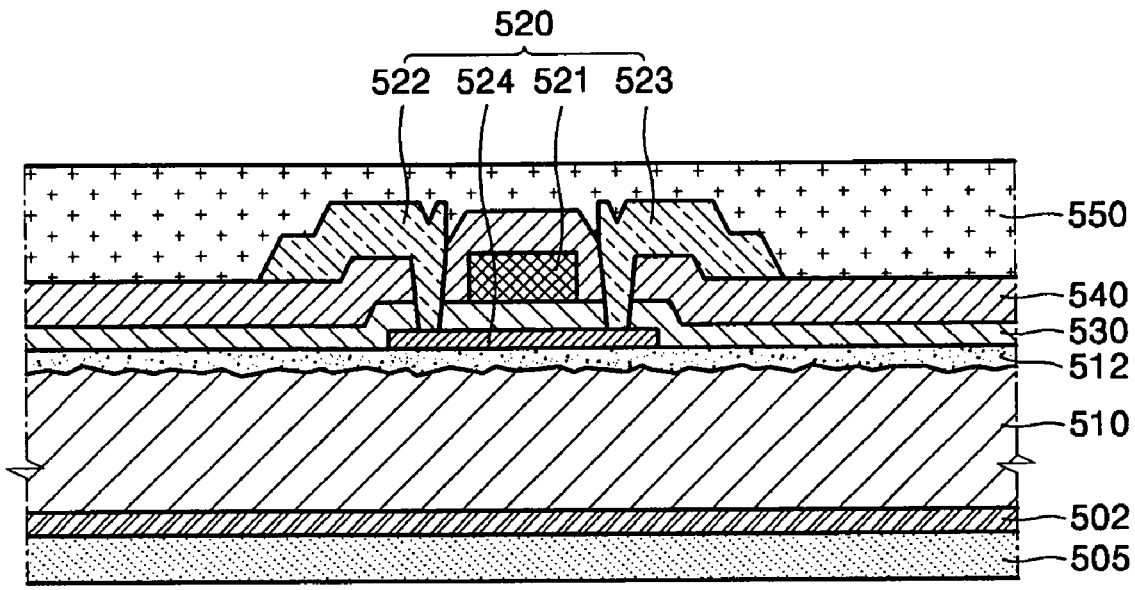
FIG. 9 is a schematic cross-section of a substrate including a thin film transistor, according to another embodiment of the present invention.

Of course, such a protective film can be applied to a substrate structure as illustrated in FIG. 6. In other words, a protective film can be formed on a thin film transistor formed on a planarization layer formed on one surface of a substrate. Hence, as illustrated in an embodiment of FIG. 9, a first layer 502 and a third layer 505 corresponding to a planarization layer 512 and a protective film 550, respectively, serve as a deformation preventing layer, thus preventing deformation of a substrate 510, detachment among layers, etc.

Figure 10:
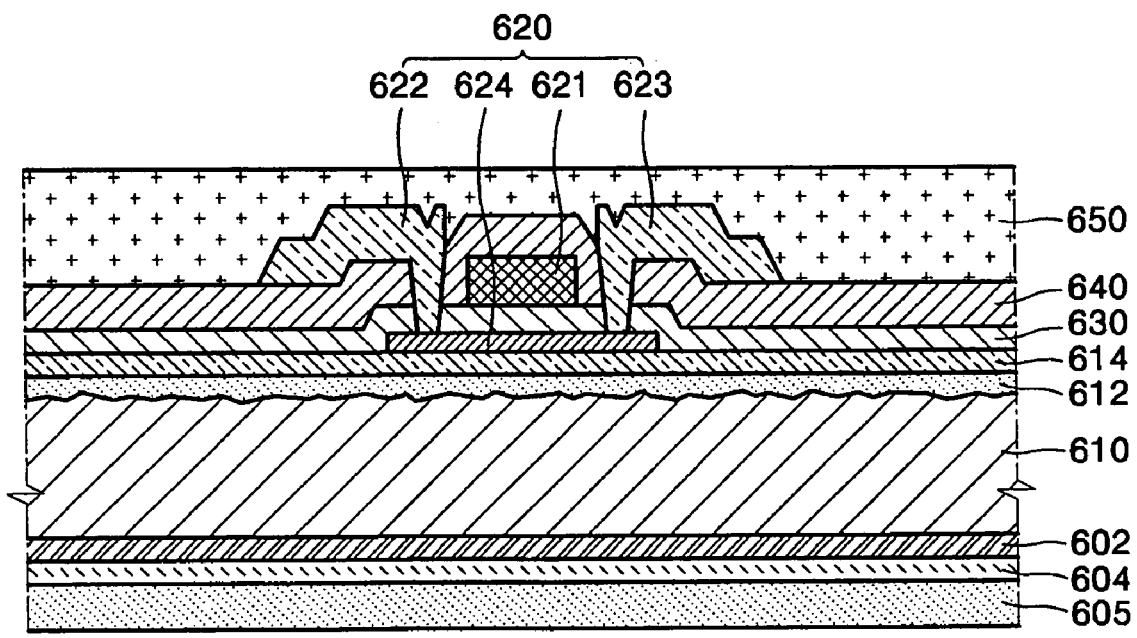
FIG. 10 is a schematic cross-section of a substrate including a thin film transistor, according to another embodiment of the present invention.

Such a protective film can also be applied to a substrate structure as illustrated in FIG. 7. In other words, a protective film can be formed on a thin film transistor formed on a buffer layer on a planarization layer formed on one surface of a substrate. Hence, as illustrated in an embodiment of FIG. 10, a first layer 602, a second layer 604, and a third layer 605 corresponding to a planarization layer 612m a buffer layer 614, and a protective film 650, respectively, serve as a deformation preventing layer, thus preventing deformation of a substrate 610, detachment among layers, etc.

Figure 11:
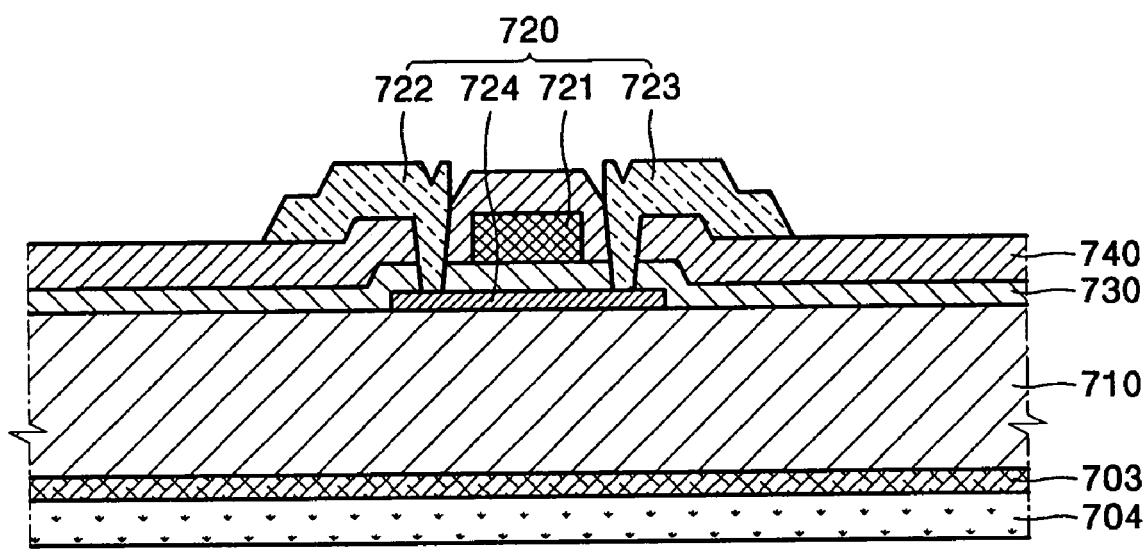
FIG. 11 is a schematic cross-section of a substrate including a thin film transistor, according to another embodiment of the present invention.

FIG. 11 is a schematic cross-section of a substrate 710 including a thin film transistor 720, according to another embodiment of the present invention. Referring to FIG. 11, the thin film transistor 720 is formed on one surface of the substrate 710, and a deformation preventing layer including two layers 703 and 704 is formed on the other surface thereof. The reason why the deformation preventing layer includes the two layers 703 and 704 is that layers formed on the entire area of the one surface of the substrate 710 are two, namely, a gate insulation film 730 and an interlayer insulation film 740.

A deformation of a substrate due to a thermal expansion coefficient difference as described above is mainly due to a difference between thermal expansion coefficients of the substrate and each layer formed on the entire surface of the substrate. Accordingly, it is preferable that a deformation prevention layer including layers corresponding to the layers formed on the entire surface of the substrate is included to offset thermal stresses produced due to differences between the substrate and the thermal expansion coefficients of the layers formed on the entire surface of the substrate. In this case, the layers included in the deformation preventing layer are preferably formed of the same materials and to the same thicknesses as those of the layers formed on the entire surface of the substrate.

Although a deformation preventing layer is formed on a substrate including a thin film transistor in the above embodiments, the deformation preventing layer can be formed on one surface of a substrate having no thin film transistors. In this case, deformation of the substrate, etc. can be prevented even when the substrate including the deformation preventing layer formed on one surface thereof undergoes high-temperature processes. Of course, all of the elements described in the above-described embodiments can be applied to the substrate that has no thin film transistors and has a deformation preventing layer formed on one surface thereof. For example, a planarization layer is formed on the other surface of the substrate, and the deformation preventing layer is formed of the same material and to the same thickness as those of the planarization layer.

A substrate having no thin film transistors and a substrate having a thin film transistor according to the present invention can have the following effects. First, in a substrate having a thin film transistor formed on one surface thereof, a deformation preventing layer is formed on the other surface of the substrate, thus preventing deformation of the substrate or detachment between layers caused by heat generated during transformation of an amorphous silicon layer into a polycrystalline silicon layer to manufacture the thin film transistor.

Second, the deformation preventing layer can also prevent deformation of the substrate or detachment between layers caused by a difference between thermal expansion coefficients of layers that can be generated during processes subsequent to formation of the thin film transistor on the substrate.

Third, in a substrate having no thin film transistors, a deformation preventing layer is formed on one surface of the substrate, thus preventing the substrate from being deformed while undergoing a high temperature process.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A thin film transistor substrate, comprising:
   a deformation preventing layer, disposed on a bottom surface of a substrate;
   a planarization layer disposed on a top surface of the substrate on an opposite side of the substrate to that of the deformation layer, the planarization layer being of the same material and thickness as that of the deformation preventing layer, the planarization layer and the deformation preventing layer are composed of a single material, and the single material is silicon oxide; and
   a thin film transistor arranged on the top surface of the planarization layer having components that include a semiconductor layer, a gate and source electrode and a source and drain electrode,
   wherein the substrate is composed of metal that is heat resistant and flexible, and
   wherein the only component of the thin film transistor that comes into direct contact with the planarization layer is the semiconductor layer.

2. The substrate of claim 1, further comprising:
   a buffer layer arranged on the planarization layer, wherein the thin film transistor is arranged on the buffer layer, and the deformation preventing layer includes a first layer of the same material and thickness as that of the planarization layer and a second layer formed of the same material and thickness as that the buffer layer.

3. The substrate of claim 1, further comprising a protective film arranged on the entire area of the top surface of the substrate to cover the thin film transistor.

4. A thin film transistor substrate, comprising:
   a deformation preventing layer, disposed on a bottom surface of a substrate;
   a planarization layer disposed on a top surface of the substrate on an opposite side of the substrate to that of the deformation layer, the planarization layer being of the same material and thickness as that of the deformation preventing layer, the planarization layer and the deformation preventing layer are composed of a single material, and the single material is silicon oxide;
   a thin film transistor arranged on the top surface of the planarization layer having components that include a semiconductor layer, a gate and source electrode and a source and drain electrode; and
   a protective film disposed to cover an entire surface of the thin film transistor,
   wherein the deformation preventing layer is of the same material and thickness as that of the protective film, and
   wherein the only component of the thin film transistor that comes into direct contact with the planarization layer is the semiconductor layer.

5. A thin film transistor substrate, comprising:
   a deformation preventing layer, disposed on a bottom surface of a substrate;
   a planarization layer disposed on a top surface of the substrate on an opposite side of the substrate to that of the deformation layer, the planarization layer being of the same material and thickness as that of the deformation preventing layer, the planarization layer and the deformation preventing layer are composed of a single material, and the single material is silicon oxide;
   a thin film transistor arranged on the top surface of the planarization layer having components that include a semiconductor layer, a gate and source electrode and a source and drain electrode; and
   a protective film disposed to cover an entire surface of the thin film transistor,
   wherein the substrate is flexible, and
   wherein the only component of the thin film transistor that comes into direct contact with the planarization layer is the semiconductor layer.

6. A thin film transistor substrate, comprising:
   a deformation preventing layer, disposed on a bottom surface of a substrate, and including at least one layer;
   a planarization layer disposed on a top surface of the substrate on an opposite side of the substrate to that of the deformation layer, the planarization layer being of the same material and thickness as that of the deformation preventing layer, the planarization layer and the deformation preventing layer are composed of a single material, and the single material is silicon oxide;
   a thin film transistor arranged on the top surface of the planarization layer having components that include a semiconductor layer, a gate and source electrode and a source and drain electrode;
   a protective film disposed to cover an entire surface of the thin film transistor; and
   a buffer layer arranged on the planarization layer, wherein the thin film transistor is arranged on the buffer layer, and the deformation preventing layer includes a first layer of the same material and thickness as that of the planarization layer, a second layer of the same material and thickness as that of the buffer layer, and a third layer of the same material and thickness as that of the protective film, wherein the substrate is flexible, and wherein the only component of the thin film transistor that comes into direct contact with the buffer layer is the semiconductor layer.

7. The substrate of claim 1, wherein the deformation preventing layer is arranged on the bottom surface of the substrate and includes layers of the same material and thickness as layers formed on the entire area of the top surface of the substrate.

8. The substrate of claim 1, wherein the substrate comprises a metal substrate.

* * * * *